(12) United States Patent
Ishimatsu (10) Patent No.: US 8,309,638 B2
(45) Date of Patent: Nov. 13, 2012

(54) CONNECTING FILM, AND JOINED STRUCTURE AND METHOD FOR PRODUCING THE SAME

(75) Inventor: Tomoyuki Ishimatsu, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 13/116,265

(22) Filed: May 26, 2011

(65) Prior Publication Data

US 2011/0223430 A1    Sep. 15, 2011

Related U.S. Application Data

(63) Continuation of application No. PCT/JP2009/069798, filed on Nov. 24, 2009.

(30) Foreign Application Priority Data

Dec. 1, 2008  (JP) ................. 2008-306292

(51) Int. Cl.
*C08K 5/00* (2006.01)
*C08K 5/17* (2006.01)
*C08K 5/42* (2006.01)
*C08K 5/55* (2006.01)

(52) U.S. Cl. ......... 524/159; 524/185; 524/236; 524/243

(58) Field of Classification Search .................. 524/236, 524/159, 185, 243; 428/426
See application file for complete search history.

(56) References Cited

U.S. PATENT DOCUMENTS

| 4,698,386 A | 10/1987 | Fujimoto |
| 6,713,523 B2 * | 3/2004 | Nagata et al. ................. 522/25 |

FOREIGN PATENT DOCUMENTS

| JP | 62-45657 A | 2/1987 |
| JP | 4-145180 A | 5/1992 |
| JP | 5-132655 A | 5/1993 |
| JP | 8-120227 A | 5/1996 |
| JP | 11-307154 A | 11/1999 |
| JP | 2004-140366 A | 5/2004 |
| JP | 2007-91798 A | 4/2007 |
| JP | 2008-69307 A | 3/2008 |

OTHER PUBLICATIONS

International Search Report (PCT/ISA/210) issued on Feb. 9, 2010, by Japanese Patent Office as the International Searching Authority for International Application No. PCT/JP2009/069798.
Written Opinion (PCT/ISA/237) issued on Feb. 9, 2010, by Japanese Patent Office as the International Searching Authority for International Application No. PCT/JP2009/069798.
International Preliminary Examination Report (PCT/IPEA/409) issued on Mar. 1, 2011, by Japanese Patent Office as the International Preliminary Examining Authority for International Application No. PCT/JP2009/069798.

\* cited by examiner

*Primary Examiner* — Kriellion Sanders
(74) *Attorney, Agent, or Firm* — Buchanan Ingersoll & Rooney PC (57) ABSTRACT

To provide a connecting film including an organic resin layer which contains a color-erasing pigment, a curable organic resin, a curing agent and a conductive particle.

4 Claims, 2 Drawing Sheets

CONNECTING FILM, AND JOINED STRUCTURE AND METHOD FOR PRODUCING THE SAME

CROSS-REFERENCE TO RELATED APPLICATION

This is a continuation of Application No. PCT/JP2009/069798, filed on Nov. 24, 2009.

BACKGROUND OF THE INVENTION

1. Field of the Invention

The present invention relates to a connecting film, a joined structure, and a method for producing the joined structure. The present invention relates particularly to a connecting film capable of electrically and mechanically connecting circuit members such as IC chips and liquid crystal display panels (LCD panels) in liquid crystal displays (LCDs); a joined structure including the connecting film; and a method for producing the joined structure.

2. Description of the Related Art

Conventionally, as a means of connecting substrates (circuit members), connecting materials in the form of tapes (e.g., anisotropic conductive films (ACFs)) have been used, which are formed by coating a release film with a curable resin containing conductive particles dispersed therein.

The anisotropic conductive films (connecting films) are used for sticking together and electrically connecting together a variety of terminals, notably for connecting a flexible printed circuit (FPC) board or a terminal of an IC chip with an ITO (indium tin oxide) electrode formed on a glass substrate of an LCD panel.

Examples of connecting films include a connecting film obtained by dispersing conductive particles in an epoxy resin, and a connecting film obtained by dispersing conductive particles in an acrylic resin. These connecting films (organic resin layers) are cured by heating to connect substrates (circuit members).

The connected state of the substrates (circuit members) is generally grasped by measuring the cure extent of a connecting film (organic resin layer) with the use of an analyzer such as an IR or DSC. However, the measurement of the cure extent of the connecting film (organic resin layer) with the use of the analyzer presents a problem in which it is necessary to extract a measurement sample from a joined structure and set the measurement sample in the analyzer, which may take time and trouble.

As a countermeasure against the foregoing problem, there has conventionally been a method of utilizing such a property of a connecting film (organic resin layer) containing an imidazole-based curing agent that the connecting film turns red when cured, and viewing the color change of the connecting film to red as an indication of completion of curing (refer, for example, to Japanese Application Laid-Open (JP-A) No. 04-145180).

Nowadays, however, pressure bonding of connecting films at a lower temperature in a shorter period of time is demanded and thus acrylic connecting films containing radical curing agents are becoming frequently used in place of connecting films containing imidazole-based curing agents. Accordingly, device makers, in particular, are strongly demanding development of a technique for estimating the cure extent of connecting films (organic resin layers) by visual observation, in the case of the acrylic connecting films containing radical curing agents as well as in the case of the connecting films containing imidazole-based curing agents.

Here, connecting films have been disclosed whose color-developing components develop color as curing proceeds (refer, for example, to JP-A Nos. 11-307154 and 2007-91798). Regarding each of these connecting films, however, the color-developing component is in a color-developing state after the connecting film has been bonded to a substrate under pressure, which is problematic in that it is difficult to identify corroded portions in an external appearance inspection (e.g., inspection for the number of conductive particles, a deformed state, etc.) and a corrosion test. Also regarding each of these connecting films, the color-developing component does not develop color before the connecting film is bonded to the substrate under pressure, thereby causing a problem in that when the connecting film is set in a temporarily affixing device, it is hard for a recognition sensor to recognize the connecting film. Meanwhile, an adhesive containing a color-erasing component (salt of a combination of a cyanine pigment and an organic boron compound) which is colored when applied but becomes colorless by photoirradiation after applied has been disclosed (refer, for example, to JP-A No. 05-132655); however, the color-erasing reaction in JP-A No. 05-132655 does not stem from reaction of a curing agent, unlike the present invention. Therefore, when the adhesive of JP-A No. 05-132655 is used for a connecting film without any change made to it, color erasure that represents the cure extent does not take place, and places subject to color erasure are not necessarily where curing has progressed, thereby causing unevenness of color erasure (JP-A No. 05-132655 is merely an invention for allowing the applied state of the adhesive to be recognized by color erasure).

BRIEF SUMMARY OF THE INVENTION

The present invention is aimed at solving the problems in related art and achieving the following object. An object of the present invention is to provide: a connecting film capable of allowing the state of connection between the connecting film and a substrate to be grasped by visual observation, and making it easily possible to identify corroded portions in an external appearance inspection and a corrosion test after the connecting film has been bonded to the substrate under pressure; a joined structure including the connecting film; and a method for producing the joined structure.

Means for solving the above-mentioned problems are as follows:

<1> A connecting film including: an organic resin layer which contains a color-erasing pigment, a curable organic resin, a curing agent and a conductive particle.

Regarding the connecting film according to <1>, since the pigment included in the organic resin layer has a color-erasing property, the state of connection between the connecting film and a substrate can be grasped by visual observation, and an external appearance inspection and a corrosion test can be easily performed after pressure bonding of the connecting film to the substrate. Also, since the connecting film according to <1> is colored before the pressure bonding of the connecting film to the substrate as well, reading performed by a recognition sensor can be facilitated when the connecting film is set in a temporarily affixing device.

<2> The connecting film according to <1>, wherein the color-erasing pigment contains a compound represented by General Formula (1) below:

General Formula (1)

where R1 and R2 each denote any one of a hydrogen atom, an alkyl group and an aryl group, Y denotes any one of a hydrogen atom, a halogen atom, an alkyl group, an aryl group, a dimethylamino group, a diethylamino group, a methoxy group and an ethoxy group, $Z^-$ denotes a counteranion, and n denotes an integer of 0 to 3.

<3> The connecting film according to <1>, wherein the color-erasing pigment contains a compound represented by General Formula (2) below:

General Formula (2)

where R1 and R2 each denote any one of a hydrogen atom, an alkyl group and an aryl group, Y denotes any one of a hydrogen atom, a halogen atom, an alkyl group, an aryl group, a dimethylamino group, a diethylamino group, a methoxy group and an ethoxy group, $Z^-$ denotes a counteranion, and n denotes an integer of 0 to 3.

<4> The connecting film according to <2> or <3>, wherein Z denotes any one of $ClO_4$, $BF_4$, $CF_3SO_3$, a compound represented by General Formula (3) below, a compound represented by General Formula (4) below, a compound represented by Structural Formula (1) below, and a compound represented by Structural Formula (2) below:

General Formula (3)

where R denotes one of a hydrogen atom and a fluorine atom, and X denotes an alkyl group,

General Formula (4)

where R denotes one of a hydrogen atom and a fluorine atom,

Structural Formula (1)

Structural Formula (2)

<5> The connecting film according to <1>, wherein the color-erasing pigment contains at least one selected from a compound represented by General Formula (5) below, a compound represented by General Formula (6) below, a compound represented by Structural Formula (3) below, a compound represented by Structural Formula (4) below, and a compound represented by General Formula (7) below:

General Formula (5)

where n denotes an integer of 1 to 3,

General Formula (6)

where n denotes an integer of 1 to 3,

Structural Formula (3)

Structural Formula (4)

General Formula (7)

where n denotes an integer of 1 to 3.

<6> The connecting film according to <1>, wherein the color-erasing pigment contains at least one selected from compounds represented by Structural Formulae (5) to (7) below:

Structural Formula (5)

Structural Formula (6)

Structural Formula (7)

<7> The connecting film according to <1>, wherein the color-erasing pigment contains at least one selected from compounds represented by Structural Formulae (8) and (9) below:

Structural Formula (8)

Structural Formula (9)

<8> The connecting film according to <1>, wherein the color-erasing pigment contains at least one selected from compounds represented by Structural Formulae (10) and (11) below:

Structural Formula (10)

Structural Formula (11)

<9> The connecting film according to <1>, wherein the color-erasing pigment contains a compound represented by Structural Formula (12) below:

Structural Formula (12)

<10> The connecting film according to <1>, wherein the color-erasing pigment contains at least one selected from compounds represented by Structural Formulae (13) to (15) below:

Structural Formula (13)

Structural Formula (14)

-continued

Structural Formula (15)

<11> The connecting film according to <1>, wherein the color-erasing pigment contains at least one selected from compounds represented by Structural Formulae (16) and (17) below:

Structural Formula (16)

Structural Formula (17)

<12> The connecting film according to <1>, wherein the color-erasing pigment contains at least one selected from compounds represented by Structural Formulae (18) and (19) below:

Structural Formula (18)

Structural Formula (19)

<13> The connecting film according to <1>, wherein the color-erasing pigment contains at least one selected from compounds represented by Structural Formulae (20) and (21) below:

Structural Formula (20)

Structural Formula (21)

<14> The connecting film according to <1>, wherein the color-erasing pigment contains at least one selected from compounds represented by Structural Formulae (22) and (23) below:

Structural Formula (22)

Structural Formula (23)

<15> The connecting film according to any one of <1> to <14>, wherein the curable organic resin is an acrylic resin, and the curing agent is a radical curing agent.
<16> The connecting film according to any one of <1> to <14>, wherein the curable organic resin is an epoxy resin, and the curing agent is a cationic curing agent.
<17> A method for producing a joined structure, including: joining first and second substrates by bonding the first and second substrates under pressure while heating or applying light to the first and second substrates, with the connecting film according to any one of <1> to <16> being placed between the first and second substrates, wherein the color-erasing pigment is in a colorless state when the organic resin layer has finished being cured in the joining.
<18> A joined structure obtained by the method according to <17>.

The present invention can solve the problems in related art and achieve the object of providing: a connecting film capable of allowing the state of connection between the connecting film and a substrate to be grasped by visual observation, and making it easily possible to identify corroded portions in an external appearance inspection and a corrosion test after the connecting film has been bonded to the substrate under pressure; a joined structure including the connecting film; and a method for producing the joined structure.

BRIEF DESCRIPTION OF THE DRAWINGS

FIG. 3 is a photograph showing states of connecting films before subjected to pressure bonding.
In FIG. 3, (1) shows a radical joining material R1, (2) shows a radical joining material A2, (3) shows a radical joining material R2, and (4) shows a radical joining material R3.

DETAILED DESCRIPTION OF THE INVENTION (Joined Structure)

A joined structure of the present invention includes a first substrate (first circuit member), a second substrate (second circuit member) and a connecting film, and may, if necessary, include suitably selected other members.

Figure 1:
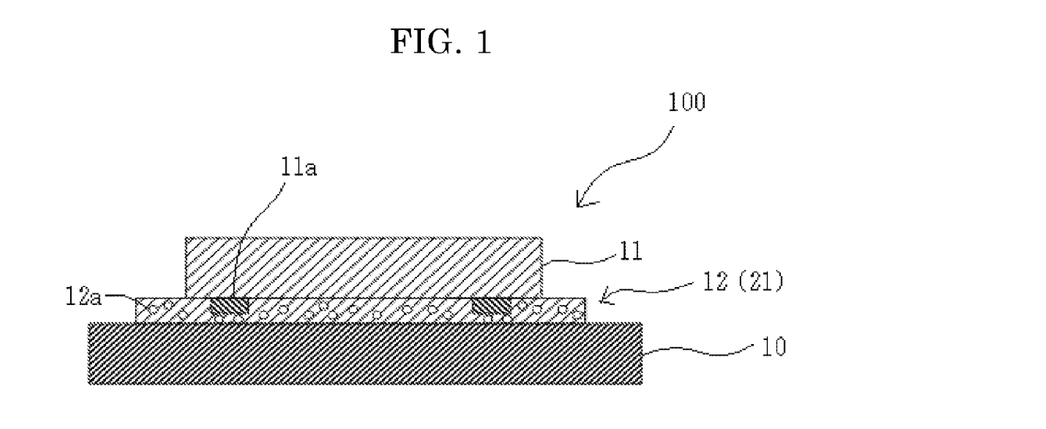
FIG. 1 is a schematic explanatory drawing showing a joined structure of the present invention.

For example, as shown in FIG. 1, a joined structure 100 includes a first substrate (first circuit member) 10, a second substrate (second circuit member) 11 and a connecting film 12 (after-mentioned organic resin layer 21). As a terminal 11a in the second substrate (second circuit member) 11, conductive particles 12a dispersed in the connecting film 12, and a terminal (not shown) in the first substrate (first circuit member) 10 are made to have continuity, the first substrate (first circuit member) 10 and the second substrate (second circuit member) 11 are electrically connected.

<First Substrate (First Circuit Member)>

The first substrate (first circuit member) is not particularly limited and may be suitably selected according to the intended purpose. Examples thereof include FPC substrates, PWB substrates, LCD substrates (LCD panels) made of glass, PDP substrates (PDP panels) made of glass, and organic EL substrate (organic EL panels) made of glass.

<Second Substrate (Second Circuit Member)>

The second substrate (second circuit member) is not particularly limited and may be suitably selected according to the intended purpose. Examples thereof include FPC substrates, COF substrates, TCP substrates, PWB substrates and IC substrates.

<Connecting Film>

The connecting film includes an organic resin layer, and may, if necessary, include suitably selected other layers. The organic resin layer is an organic resin layer which contains a conductive particle (hereinafter this layer will be referred to also as "conductive particle-containing organic resin layer").

Figure 2:
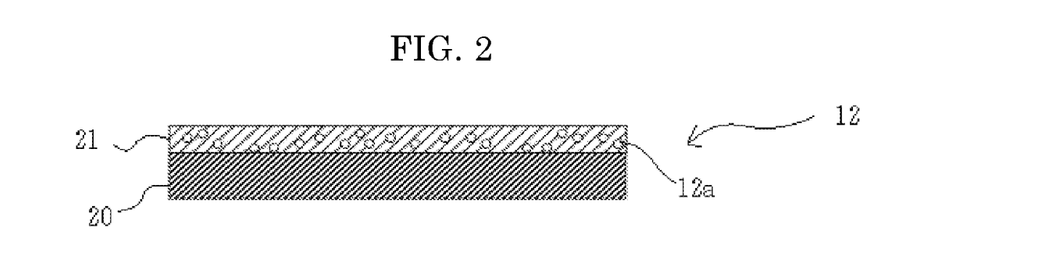
FIG. 2 is a schematic explanatory drawing showing a connecting film of the present invention.

For example, as shown in FIG. 2, a connecting film 12 includes a release layer (separator) 20, and a conductive particle-containing organic resin layer 21 formed on the release layer (separator) 20.

<<Organic Resin Layer>>

The organic resin layer is not particularly limited and may be suitably selected according to the intended purpose, provided that it is placed between the first substrate (first circuit member) and the second substrate (second circuit member) and contains a color-erasing pigment, a curable organic resin, a curing agent and a conductive particle. For example, the organic resin layer may further contain a silane coupling agent, a surfactant, etc.

Also, the organic resin layer may be composed of a single layer or may be composed of a plurality of layers. In the case where it is composed of a plurality of layers, note that the color-erasing pigment, the curable organic resin, the curing agent and the conductive particle may be contained in the same layer or may be contained in different layers.

Also, a joining material that forms the organic resin layer may be in paste form or may be in film form.

<<<Color-erasing Pigment>>>

The color-erasing pigment is not particularly limited and may be suitably selected according to the intended purpose, provided that it erases color (becomes colorless or turns a color (yellow or pale yellow) similar to the color (pale yellow) of the conductive particle described later) after the connecting film has been subjected to pressure bonding. Examples of the color-erasing pigment include a diarylmethane pigment, a triarylmethane pigment, a cyanine pigment and a polymethine pigment, each of which may contain an amino group or a derived amino group; and a heterocyclic pigment having, as its backbone, at least one of xanthene, azine, acridine, thiazine and oxazine. More specific examples of the color-erasing pigment include compounds represented by General Formulae (1), (2) and (5) to (7) below, and compounds represented by Structural Formulae (3) to (23) below. Note that only one of these color-erasing pigments may be contained in the organic resin layer, or two or more of these color-erasing pigments may be contained therein. Further, a plurality of cationic portions (portions other than counteranions) of any of these color-erasing pigments may be contained therein.

Also, the amount of the color-erasing pigment is preferably in the range of 0.5 parts by mass to 3.0 parts by mass per 100 parts by mass as the total amount of a binder (including the curable resin and other resin(s)) contained in the organic resin layer, and is preferably in the range of 3.0 parts by mass to 6.0 parts by mass per 100 parts by mass of the curable resin contained in the organic resin layer.

The compound represented by Structural Formula (3) below is red before the connecting film is subjected to pressure bonding but becomes colorless after the connecting film has been subjected to the pressure bonding, the compound represented by Structural Formula (5) below is blue before the connecting film is subjected to pressure bonding but turns pale yellow after the connecting film has been subjected to the pressure bonding, the compound represented by Structural Formula (7) below is purple before the connecting film is subjected to pressure bonding but turns yellow after the connecting film has been subjected to the pressure bonding, the compound represented by Structural Formula (8) below is red before the connecting film is subjected to pressure bonding but becomes colorless after the connecting film has been subjected to the pressure bonding, the compound represented by Structural Formula (9) below is red before the connecting film is subjected to pressure bonding but becomes colorless after the connecting film has been subjected to the pressure bonding, the compound represented by Structural Formula (10) below is yellow before the connecting film is subjected to pressure bonding but turns pale yellow after the connecting film has been subjected to the pressure bonding, the compound represented by Structural Formula (11) below is yellow before the connecting film is subjected to pressure bonding but turns pale yellow after the connecting film has been subjected to the pressure bonding, the compound represented by Structural Formula (12) below is blue before the connecting film is subjected to pressure bonding but becomes colorless after the connecting film has been subjected to the pressure bonding, the compound represented by Structural Formula (13) below is blue before the connecting film is subjected to pressure bonding but becomes colorless after the connecting film has been subjected to the pressure bonding, and the compound represented by Structural Formula (14) below is blue before the connecting film is subjected to pressure bonding but turns pale yellow after the connecting film has been subjected to the pressure bonding.

General Formula (1)

In General Formula (1), R1 and R2 each denote any one of a hydrogen atom, an alkyl group and an aryl group, Y denotes any one of a hydrogen atom, a halogen atom, an alkyl group, an aryl group, a dimethylamino group, a diethylamino group, a methoxy group and an ethoxy group, $Z^-$ denotes a counteranion, and n denotes an integer of 0 to 3.

Examples of the counteranion ($Z^-$) include halogen ions, perchlorate ions, paratoluenesulfonate ions, trifluoromethanesulfonate ions, trifluoroacetate ions, tetraalkylboron anions, tetrafluoroboron ions and oxalate ions; note that the counteranion is not particularly limited, provided that it has a highly stable structure. The reaction speed and the storage stability can be enhanced depending upon the type of the counteranion, and the counteranion may be selectively used according to the intended use.

Specific examples of Z of the counteranion ($Z^-$) include $ClO_4$, $BF_4$, $CF_3SO_3$, compounds represented by General Formula (3) below, compounds represented by General Formula (4) below, the compound represented by Structural Formula (1) below, and the compound represented by Structural Formula (2) below.

General Formula (3)

In General Formula (3), R denotes one of a hydrogen atom and a fluorine atom, and X denotes an alkyl group.

General Formula (4)

In General Formula (4), R denotes one of a hydrogen atom and a fluorine atom.

Structural Formula (1)

Structural Formula (2)

General Formula (2)

In General Formula (2), R1 and R2 each denote any one of a hydrogen atom, an alkyl group and an aryl group, Y denotes any one of a hydrogen atom, a halogen atom, an alkyl group, an aryl group, a dimethylamino group, a diethylamino group, a methoxy group and an ethoxy group, $Z^-$ denotes a counteranion, and n denotes an integer of 0 to 3.

The counteranion ($Z^-$) is the same as or similar to the counteranion in General Formula (1).

General Formula (5)

In General Formula (5), n denotes an integer of 1 to 3.

General Formula (6)

In General Formula (6), n denotes an integer of 1 to 3.

Structural Formula (3)

Structural Formula (4)

General Formula (7)

In General Formula (7), n denotes an integer of 1 to 3.

Structural Formula (5)

Structural Formula (6)

Structural Formula (7)

Structural Formula (8)

Structural Formula (9)

Structural Formula (10)

Structural Formula (11)

Structural Formula (12)

Structural Formula (13)

Structural Formula (14)

Structural Formual (15)

Structural Formula (16)

Structural Formula (17)

Structural Formula (18)

-continued

Structural Formula (19)

Structural Formula (20)

Structural Formula (21)

Structural Formula (22)

Structural Formula (23)

Additionally, a light stabilizer may be added to the color-erasing pigment. The light stabilizer is not particularly limited and may be suitably selected according to the intended purpose. Examples thereof include benzotriazole light stabilizers and hindered amine light stabilizers. Addition of the light stabilizer makes it possible to suppress discoloration before use.

<<<<Principle of Color Erasure of Color-erasing Pigment>>>>

The following explains a principle of color erasure of the color-erasing pigment.

A color-erasing reaction in relation to a radical reaction is presumably due to the following: a radical curing agent dissociates by heat or light and releases a radical, and the released radical and the color-erasing pigment bond together, as shown by Reaction Formula (1) below.

Reaction Formula (1)

A color-erasing reaction in relation to a cationic reaction is presumably due to the reaction represented by Reaction Formula (2) below. In the color-erasing reaction in relation to the cationic reaction, presumably the color-erasing reaction in relation to the radical reaction also takes place at the same time.

Reaction Formula (2)

<<<Curable Organic Resin>>>

The curable organic resin is not particularly limited and may be suitably selected according to the intended purpose. The curable organic resin is preferably a thermosetting organic resin, more preferably an acrylic resin, an epoxy resin, etc.

<<<<Acrylic Resin>>>>

The acrylic resin is not particularly limited and may be suitably selected according to the intended purpose. Examples thereof include acrylic resins such as methyl acrylate, ethyl acrylate, isopropyl acrylate, isobutyl acrylate, epoxy acrylate, ethylene glycol diacrylate, diethylene glycol diacrylate, trimethylolpropane triacrylate, dimethyloltricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate and urethane acrylate. These may be used individually or in combination.

Examples thereof also include compounds obtained by replacing the acrylates of the above-mentioned compounds with methacrylates, and these obtained compounds may be used individually or in combination.

<<<<Epoxy Resin>>>>

The epoxy resin is not particularly limited and may be suitably selected according to the intended purpose. Examples thereof include thermosetting epoxy resins such as bisphenol A epoxy resins, bisphenol F epoxy resins, novolac epoxy resins, and epoxy resins obtained by modifying these epoxy resins. These may be used individually or in combination.

<<<Curing Agent>>>

The curing agent is not particularly limited and may be suitably selected according to the intended purpose. In the case where the curable organic resin is an acrylic resin, the curing agent is preferably a radical curing agent; in the case where the curable organic resin is an epoxy resin, the curing agent is preferably a cationic curing agent.

<<<<Radical Curing Agent>>>>

The radical curing agent is not particularly limited and may be suitably selected according to the intended purpose. Examples thereof include organic peroxides.

<<<<Cationic Curing Agent>>>>

The cationic curing agent is not particularly limited and may be suitably selected according to the intended purpose. Examples thereof include sulfonium salts and onium salts, with preference being given to aromatic sulfonium salts.

<<<Conductive Particle>>>

The conductive particle is not particularly limited, and any conductive particle for use in a conventional anisotropic conductive adhesive (connecting film) can be utilized. For example, a metal-coated resin particle or metal particle having a diameter of 1 μm to 50 μm can be used.

Examples of the metal particle include particles of nickel, cobalt and copper. Particles whose surfaces are coated with gold and/or palladium may also be used for the purpose of preventing oxidation of the surfaces. Further, particles whose surfaces are provided with insulating films formed of organic matter or metal protrusions may be used as well.

Examples of the metal-coated resin particle include truly spherical particles plated with one or more metals selected from nickel, cobalt, copper and the like. Particle whose outermost surfaces are coated with gold and/or palladium may be used as well. Further, particles whose surfaces are provided with insulating films formed of organic matter or metal protrusions may be used as well.

<<Other Layers>>

The above-mentioned other layers are not particularly limited and may be suitably selected according to the intended purpose. Examples thereof include a release layer.

The shape, structure, size, thickness, material, etc. of the release layer of the release layer are not particularly limited and may be suitably selected according to the intended purpose. Preference is given to a release layer which has favorable releasability and/or superior heat resistance, preferred examples of which include a transparent releasable PET (polyethylene terephthalate) sheet coated with a release agent such as silicone. Also, a PTFE (polytetrafluoroethylene) sheet may be used as well.

<Other Members>

The above-mentioned other members are not particularly limited and may be suitably selected according to the intended purpose.

(Method for Producing Joined Structure)

A method of the present invention for producing a joined structure includes a joining step and may, if necessary, include suitably selected other steps.

<Joining Step>

The joining step is a step of joining first and second substrates by bonding the first and second substrates under pressure while heating or applying light to the first and second substrates, with the connecting film of the present invention being placed between the first and second substrates.

The heating is determined by the total quantity of heat; in the case where the joining is completed within a connection time of 10 seconds, the heating temperature is in the range of 120° C. to 220° C.

The application of light is performed with a UV irradiator such as a mercury lamp or metal halide lamp.

The pressure bonding varies depending upon the type of the second substrate; in the case where the second substrate is an FPC board produced by TAB (tape-automated bonding), the pressure is in the range of 2 MPa to 6 MPa; in the case where the second substrate is an IC chip, the pressure is in the range of 30 MPa to 150 MPa. In each case, the length of time for the pressure bonding is in the range of 3 seconds to 10 seconds.

Additionally, the joining may be performed using an ultrasonic wave.

EXAMPLES

The following explains the present invention in further detail, referring to Examples and Comparative Examples; note that the present invention is not confined to these Examples. Hereinafter, the term "part(s)" means "part(s) by mass".

(Production of Radical Joining Material R1)

Conductive particles (AUL704, resin core Au coated particles, manufactured by SEKISUI CHEMICAL CO., LTD.) were dispersed into an adhesive composed of 60 parts of a phenoxy resin (product name: YP50, bisphenol A type phenoxy resin, manufactured by Tohto Kasei Co., Ltd.), 35 parts of a radical polymerizable resin (product name: EB-600, epoxy acrylate, manufactured by DAICEL-CYTEC Company LTD.) as a curable resin, 2 parts of a silane coupling agent (product name: KBM-503, manufactured by Shin-Etsu Chemical Co., Ltd.) and 3 parts of a reaction initiator (product name: PERHEXA C, 1,1-Di(t-butylperoxy) cyclohexane, manufactured by NOF CORPORATION, 10-hour half-life temperature: 90.7° C.) as a radical curing agent, such that the particle density (expressed by the number of particles per square millimeter) became 10,000 /mm$^2$, and a radical joining material R1 having a thickness of 15 μm was thus obtained. This radical joining material R1 was pale yellow, which was the color of the conductive particles (see (1) in FIG. 3).

(Production of Radical Joining Material R2)

In the radical joining material R1, 1 part of a quinone pigment, i.e., C.I. Solvent Blue 35: ammonium, ethyl(4-(p-(ethyl(m-sulfobenzyl)amino)-alpha-(o-sulfophenyl)benzylidene)-2,5-cyclohexadien-1-ylidene)(m-sulfobenzyl)-, hydroxide, manufactured by, HODOGAYA CHEMICAL CO., LTD., was included to obtain a radical joining material R2. This radical joining material R2 was blue (see (3) in FIG. 3).

(Production of Radical Joining Material R3)

In the radical joining material R1, 1 part of a triphenylmethane pigment, i.e., C.I. Solvent Red 18: ammonium, (6-(diethylamino)-9-(2,4-disulfophenyl)-3h-xanthen-3-ylidene)diethyl-, hydroxide, manufactured by HODOGAYA CHEMICAL CO., LTD., was included to obtain a radical joining material R3. This radical joining material R3 was red (see (4) in FIG. 3).

(Production of Cationic Joining Material C1)

Conductive particles (AUL704, manufactured by SEKISUI CHEMICAL CO., LTD.) were dispersed into an adhesive composed of 60 parts of a phenoxy resin (product name: YP50, manufactured by Tohto Kasei Co., Ltd.), 35 parts of an epoxy resin (product name: EP-828, bisphenol A type epoxy resin, manufactured by Japan Epoxy Resins Co. Ltd.) as a curable resin, 2 parts of a silane coupling agent (product name: KBM-403, 3-Glycidyloxypropyltrimethoxysilane, manufactured by Shin-Etsu Chemical Co., Ltd.) and 3 parts of a reaction initiator (product name: SI-80L, manufactured by SANSHIN CHEMICAL INDUSTRY CO., LTD.) as a cationic curing agent, such that the particle density (expressed by the number of particles per square millimeter) became 10,000 /mm², and a cationic joining material C1 having a thickness of 15 μm was thus obtained. This cationic joining material C1 was pale yellow, which was the color of the conductive particles.

Radical joining materials A1 to A10 were respectively obtained by inclusion of 1 part each of pigments P1 to P10 represented by General Formula (1) below (with R1, R2, Y, n and Z being as shown in Table 1) in the radical joining material R1. All these radical joining materials A1 to A10 were blue in color. A photograph of the radical joining material A2, a joining material with P2 (1,1,5,5,-tetrakis[4-(diethylamino)phenyl]-1,4-pentadiene-3-ylium-p-toluenesulfonate) being used as a pigment, is shown as (2) in FIG. 3.

General Formula (1)

TABLE 1

| Pigment No. | R1 | R2 | Y | n | Z | Absorption wavelength (cm⁻¹) |
|---|---|---|---|---|---|---|
| P1 | $C_2H_5$ | $C_2H_5$ | $OCH_3$ | 1 | $CF_3SO_3$ | 819 |
| P2 | $C_2H_5$ | $C_2H_5$ | $N(C_2H_5)_2$ | 1 | p-toluenesulfonate | 817 |
| P3 | $C_2H_5$ | $C_2H_5$ | H | 1 | p-toluenesulfonate | 830 |
| P4 | $CH_3$ | $CH_3$ | $N(CH_3)_2$ | 0 | $ClO_4$ | 740 |
| P5 | $CH_3$ | $CH_3$ | $N(CH_3)_2$ | 1 | $ClO_4$ | 810 |
| P6 | $CH_3$ | $CH_3$ | $N(CH_3)_2$ | 2 | $ClO_4$ | 911 |
| P7 | $CH_3$ | $CH_3$ | $CH_3$ | 1 | $ClO_4$ | 814 |
| P8 | $CH_3$ | $CH_3$ | $OCH_3$ | 1 | p-toluenesulfonate | 809 |
| P9 | $CH_3$ | $CH_3$ | $N(CH_3)_2$ | 1 | triphenyl(pentyl)borate | 818 |
| P10 | $CH_3$ | $CH_3$ | $N(CH_3)_2$ | 1 | tris(3-fluorophenyl)(pentyl)borate | 818 |

(Production of Radical Joining Material A11)

A radical joining material, named "radical joining material A11", was obtained in the same manner as in the production of the radical joining material A1, except that PEROCTA ND (manufactured by NOF CORPORATION, 10-hour half-life temperature: 40.7° C.) was used as a reaction initiator instead of PERHEXA C (manufactured by NOF CORPORATION, 10-hour half-life temperature: 90.7° C.).

(Production of Radical Joining Material A12)

A radical joining material, named "radical joining material A12", was obtained in the same manner as in the production of the radical joining material A1, except that PERHEXYNE 25B (manufactured by NOF CORPORATION, 10-hour half-life temperature: 128.4° C.) was used as a reaction initiator instead of PERHEXA C (manufactured by NOF CORPORATION, 10-hour half-life temperature: 90.7° C.).

(Production of Radical Joining Materials A13 to A17)

Radical joining materials A13 to A17 were respectively obtained by inclusion of 1 part each of pigments P11 to P15 respectively represented by Structural Formulae (7) to (9), (12) and (13) below in the radical joining material R1.

Structural Formula (7)

Structural Formula (8)

-continued

Structural Formula (9)

Structural Formula (12)

Structural Formula (13)

(Production of Cationic Joining Material A18)

A cationic joining material A18 was obtained by inclusion of 1 part of the pigment P14 represented by Structural Formula (12) below in the cationic joining material C1.

Structural Formula (12)

Example 1

(Production of Joined Structure)

A COF substrate (Sony Chemical & Information Device Corporation, base material for evaluation, 50 μmP, Sn-plated Cu with a thickness of 8 μm, S'PERFLEX base material with a thickness of 38 μm) and ITO-coated glass (Sony Chemical & Information Device Corporation, base material for evaluation, entire surface coating with ITO, 0.7 mm in glass thickness) were to be joined together. Firstly, the ITO-coated glass was laminated with the radical joining material A1 having a width of 1.5 mm, then the COF substrate was temporarily fixed thereon, and subsequently the COF substrate and the ITO-coated glass were joined together under joining conditions of 190° C., 3 MPa and 10 seconds by means of a heat tool for a width of 1.5 mm, using a buffer (Teflon (registered trademark), thickness: 100 μm), to obtain a joined structure AJ1.

(Confirmation of Color Erasure After Assembly)

Regarding the connecting film in the joined structure AJ1 produced, the extent of color erasure was visually observed. The results are shown in Tables 2-1 and 2-2.

(Measurement of Connection Resistance of Joined Structure)

Regarding the joined structure AJ1 produced, the resistance value (Ω) of the connection resistance with application of a current of 1 mA was measured by four-terminal sensing using a digital multimeter (DIGITAL MULTIMETER 7555, manufactured by Yokogawa Electric Corporation). The results are shown in Tables 2-1 and 2-2.

(Measurement of Adhesion Strength of Joined Structure)

Regarding the joined structure AJ1 produced, the adhesion strength of the COF substrate and the ITO-coated glass was measured when the COF substrate was pulled upward at a measurement speed of 50 mm/sec using a tensile tester (RTC1201, manufactured by A&D Company, Limited). The results are shown in Tables 2-1 and 2-2.

Example 2

Figure 5:
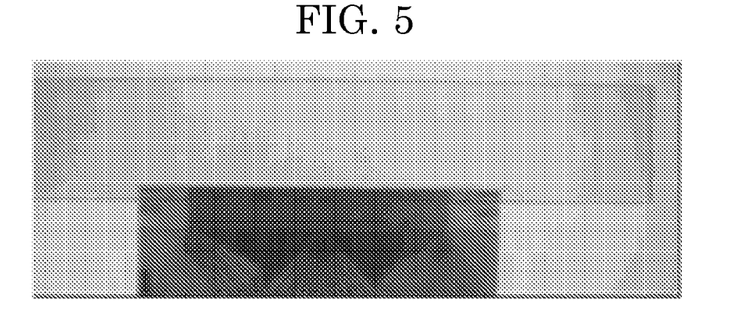
FIG. 5 is a photograph showing a result of confirmation of color erasure after assembly regarding Example 2.

A joined structure, named "joined structure AJ2", was produced in the same manner as in Example 1, except that the radical joining material A2 was used instead of the radical joining material A1. Also, confirmation of color erasure after assembly (see FIG. 5), measurement of the connection resistance of the joined structure, and measurement of the adhesion strength of the joined structure were carried out as in Example 1. The results are shown in Table 2-1.

Example 3

A joined structure, named "joined structure AJ3", was produced in the same manner as in Example 1, except that the radical joining material A3 was used instead of the radical joining material A1. Also, confirmation of color erasure after assembly, measurement of the connection resistance of the joined structure, and measurement of the adhesion strength of the joined structure were carried out as in Example 1. The results are shown in Table 2-1.

Example 4

A joined structure, named "joined structure AJ4", was produced in the same manner as in Example 1, except that the radical joining material A4 was used instead of the radical joining material A1. Also, confirmation of color erasure after assembly, measurement of the connection resistance of the joined structure, and measurement of the adhesion strength of the joined structure were carried out as in Example 1. The results are shown in Table 2-1.

Example 5

A joined structure, named "joined structure AJ5", was produced in the same manner as in Example 1, except that the radical joining material A5 was used instead of the radical joining material A1. Also, confirmation of color erasure after assembly, measurement of the connection resistance of the joined structure, and measurement of the adhesion strength of the joined structure were carried out as in Example 1. The results are shown in Table 2-1.

Example 6

A joined structure, named "joined structure AJ6", was produced in the same manner as in Example 1, except that the radical joining material A6 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Example 7

A joined structure, named "joined structure AJ7", was produced in the same manner as in Example 1, except that the radical joining material A7 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Example 8

A joined structure, named "joined structure AJ8", was produced in the same manner as in Example 1, except that the radical joining material A8 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Example 9

A joined structure, named "joined structure AJ9", was produced in the same manner as in Example 1, except that the radical joining material A9 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Example 10

A joined structure, named "joined structure AJ10", was produced in the same manner as in Example 1, except that the radical joining material A10 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Example 11

A joined structure, named "joined structure AJ11", was produced in the same manner as in Example 1, except that the radical joining material A11 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Example 12

A joined structure, named "joined structure AJ12", was produced in the same manner as in Example 1, except that the radical joining material A12 was used instead of the radical joining material A1. Also, confirmation of color erasure after assembly, measurement of the connection resistance of the joined structure, and measurement of the adhesion strength of the joined structure were carried out as in Example 1. The results are shown in Table 2-2.

Comparative Example 1

A joined structure, named "joined structure RJ1", was produced in the same manner as in Example 1, except that the radical joining material R1 was used instead of the radical joining material A1. Also, confirmation of color erasure after assembly, measurement of the connection resistance of the joined structure, and measurement of the adhesion strength of the joined structure were carried out as in Example 1. The results are shown in Table 2-1.

TABLE 2-1

|  | Comp. Ex. 1 | Ex. 1 | Ex. 2 | Ex. 3 | Ex. 4 | Ex. 5 |
|---|---|---|---|---|---|---|
| Joined structure | RJ1 | AJ1 | AJ2 | AJ3 | AJ4 | AJ5 |
| Pigment | — | P1 | P2 | P3 | P4 | P5 |
| Method of joining | Curing with heat | Curing with heat | Curing with heat | Curing with heat | Curing with heat | Curing with heat |
| Color before joining | Pale yellow | Blue | Blue | Blue | Blue | Blue |
| Color after joining | Pale yellow | Pale yellow | Pale yellow | Pale yellow | Pale yellow | Pale yellow |
| Resistance value (Ω) | 1.22 | 1.21 | 1.22 | 1.23 | 1.22 | 1.21 |
| Adhesion strength (N/cm) | 8.7 | 8.8 | 8.7 | 8.6 | 8.8 | 8.8 |

Pale yellow: color of conductive particle

TABLE 2-2

|  | Ex. 6 | Ex. 7 | Ex. 8 | Ex. 9 | Ex. 10 | Ex. 11 | Ex. 12 |
|---|---|---|---|---|---|---|---|
| Joined structure | RJ6 | AJ7 | AJ8 | AJ9 | AJ10 | AJ11 | AJ12 |
| Pigment | P6 | P7 | P8 | P9 | P10 | P1 | P1 |
| Method of joining | Curing with heat | Curing with heat | Curing with heat | Curing with heat | Curing with heat | Curing with heat | Curing with heat |
| Color before joining | Blue | Blue | Blue | Blue | Blue | Blue | Blue |

TABLE 2-2-continued

|  | Ex. 6 | Ex. 7 | Ex. 8 | Ex. 9 | Ex. 10 | Ex. 11 | Ex. 12 |
|---|---|---|---|---|---|---|---|
| Color after joining | Pale yellow | Pale yellow | Pale yellow | Pale yellow | Pale yellow | Pale yellow | Pale yellow |
| Resistance value (Ω) | 1.21 | 1.22 | 1.22 | 1.22 | 1.22 | 1.21 | 1.23 |
| Adhesion strength (N/cm) | 8.7 | 8.6 | 8.7 | 8.8 | 8.7 | 8.7 | 8.6 |

Pale yellow: color of conductive particle

Example 13

A joined structure, named "joined structure AJ13", was produced in the same manner as in Example 1, except that the radical joining material A13 was used instead of the radical joining material A1. Also, confirmation of color erasure after assembly, measurement of the connection resistance of the joined structure, and measurement of the adhesion strength of the joined structure were carried out as in Example 1. The results are shown in Table 3-1.

Example 14

A joined structure, named "joined structure AJ14", was produced in the same manner as in Example 1, except that the radical joining material A14 was used instead of the radical joining material A1. Also, confirmation of color erasure after assembly, measurement of the connection resistance of the joined structure, and measurement of the adhesion strength of the joined structure were carried out as in Example 1. The results are shown in Table 3-1.

Example 15

A joined structure, named "joined structure AJ15", was produced in the same manner as in Example 1, except that the radical joining material A15 was used instead of the radical joining material A1. Also, confirmation of color erasure after assembly, measurement of the connection resistance of the joined structure, and measurement of the adhesion strength of the joined structure were carried out as in Example 1. The results are shown in Table 3-1.

Example 16

A joined structure, named "joined structure AJ16", was produced in the same manner as in Example 1, except that the radical joining material A16 was used instead of the radical joining material A1. Also, confirmation of color erasure after assembly, measurement of the connection resistance of the joined structure, and measurement of the adhesion strength of the joined structure were carried out as in Example 1. The results are shown in Table 3-2.

Example 17

A joined structure, named "joined structure AJ17", was produced in the same manner as in Example 1, except that the radical joining material A17 was used instead of the radical joining material A1. Also, confirmation of color erasure after assembly, measurement of the connection resistance of the joined structure, and measurement of the adhesion strength of the joined structure were carried out as in Example 1. The results are shown in Table 3-2.

Example 18

A joined structure, named "joined structure AJ18", was produced in the same manner as in Example 1, except that the cationic joining material A18 was used instead of the radical joining material A1. Also, confirmation of color erasure after assembly, measurement of the connection resistance of the joined structure, and measurement of the adhesion strength of the joined structure were carried out as in Example 1. The results are shown in Table 3-2.

Example 19

(Production of Joined Structure)

A COF substrate (Sony Chemical & Information Device Corporation, base material for evaluation, 50 μmP, Sn-plated Cu with a thickness of 8 μm, S'PERFLEX base material with a thickness of 38 μm) and ITO-coated glass (Sony Chemical & Information Device Corporation, base material for evaluation, entire surface coating with ITO, 0.7 mm in glass thickness) were to be joined together. Firstly, the ITO-coated glass was laminated with the cationic joining material A18 having a width of 1.5 mm, then the COF substrate was temporarily fixed thereon; subsequently, while the COF substrate was covered with a buffer (Teflon (registered trademark), thickness: 100 μm) and pushed with a force of 5 MPa using a tool for a width of 1.5 mm, the COF substrate and the ITO-coated glass were joined together with application of light at a dose of 3,000 mJ/cm$^2$ for 20 seconds using a metal halide lamp placed on the ITO-coated glass side, and a joined structure AJ19 was thus obtained.

(Confirmation of Color Erasure after Assembly)

Regarding the cationic joining material A18 in the joined structure AJ19 produced, the extent of color erasure was visually observed. The results are shown in Tables 3-1 and 3-2.

(Measurement of Connection Resistance of Joined Structure)

Regarding the joined structure AJ19 produced, the resistance value (Ω) of the connection resistance with application of a current of 1 mA was measured by four-terminal sensing using a digital multimeter (DIGITAL MULTIMETER 7555, manufactured by Yokogawa Electric Corporation). The results are shown in Tables 3-1 and 3-2.

(Measurement of Adhesion Strength of Joined Structure)

Regarding the joined structure AJ19 produced, the adhesion strength of the COF substrate and the ITO-coated glass was measured when the COF substrate was pulled upward at a measurement speed of 50 mm/sec using a tensile tester (RTC1201, manufactured by A&D Company, Limited). The results are shown in Tables 3-1 and 3-2.

Comparative Example 2

A joined structure, named "joined structure CJ1", was produced in the same manner as in Example 18, except that the cationic joining material C1 was used instead of the cationic joining material A18. Also, confirmation of color erasure after assembly, measurement of the connection resistance of the joined structure, and measurement of the adhesion strength of the joined structure were carried out as in Example 18. The results are shown in Tables 3-1.

TABLE 3-1

|  | Comp. Ex. 1 | Comp. Ex. 2 | Ex. 13 | Ex. 14 | Ex. 15 |
|---|---|---|---|---|---|
| Joined structure | RJ1 | CJ1 | AJ13 | AJ14 | AJ15 |
| Pigment | — | — | P11 | P12 | P13 |
| Method of joining | Curing with heat | Curing with heat | Curing with heat | Curing with heat | Curing with heat |
| Color before joining | Pale yellow | Pale yellow | Purple | Red | Red |
| Color after joining | Pale yellow | Pale yellow | Pale yellow | Pale yellow | Pale yellow |
| Resistance value ($\Omega$) | 1.22 | 1.21 | 1.22 | 1.23 | 1.22 |
| Adhesion strength (N/cm) | 8.7 | 8.8 | 8.7 | 8.6 | 8.8 |

Pale yellow: color of conductive particle

TABLE 3-2

|  | Ex. 16 | Ex. 17 | Ex. 18 | Ex. 19 |
|---|---|---|---|---|
| Joined structure | AJ16 | AJ17 | AJ18 | AJ19 |
| Pigment | P14 | P15 | P14 | P14 |
| Method of joining | Curing with heat | Curing with heat | Curing with heat | Curing with light |
| Color before joining | Blue | Blue | Blue | Blue |
| Color after joining | Pale yellow | Pale yellow | Pale yellow | Pale yellow |
| Resistance value ($\Omega$) | 1.22 | 1.22 | 1.22 | 1.21 |
| Adhesion strength (N/cm) | 8.6 | 8.8 | 8.7 | 8.7 |

Pale yellow: color of conductive particle

Comparative Example 3

Figure 6:
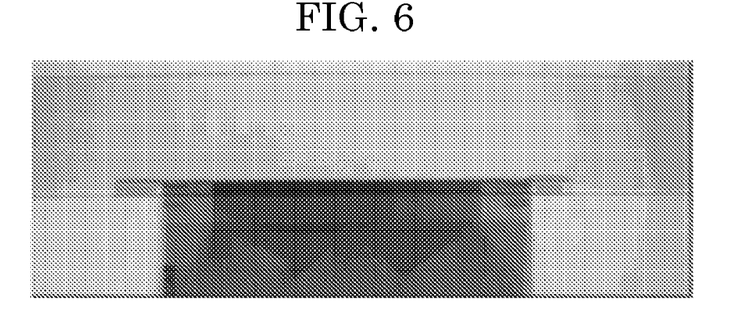
FIG. 6 is a photograph showing a result of confirmation of color erasure after assembly regarding Comparative Example 3.

A joined structure, named "joined structure RJ2", was produced in the same manner as in Example 1, except that the radical joining material R2 was used instead of the radical joining material A1. Also, confirmation of color erasure after assembly (see FIG. 6), measurement of the connection resistance of the joined structure, and measurement of the adhesion strength of the joined structure were carried out as in Example 1. The results are shown in Table 4.

Comparative Example 4

Figure 7:
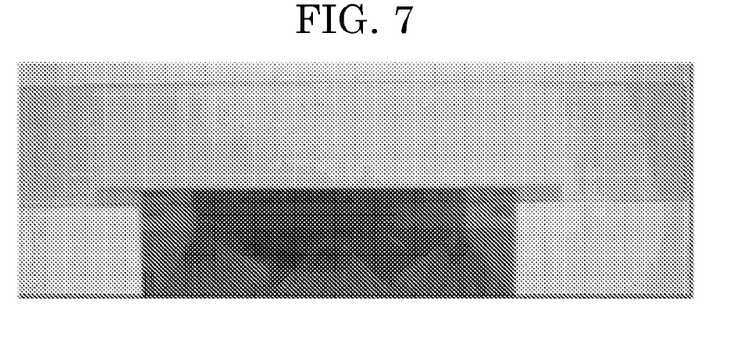
FIG. 7 is a photograph showing a result of confirmation of color erasure after assembly regarding Comparative Example 4.

A joined structure, named "joined structure RJ3", was produced in the same manner as in Example 1, except that the radical joining material R3 was used instead of the radical joining material A1. Also, confirmation of color erasure after assembly (see FIG. 7), measurement of the connection resistance of the joined structure, and measurement of the adhesion strength of the joined structure were carried out as in Example 1. The results are shown in Table 4.

TABLE 4

|  | Comp. Ex. 1 | Comp. Ex. 2 | Comp. Ex. 3 | Comp. Ex. 4 |
|---|---|---|---|---|
| Joined structure | RJ1 | AJ2 | RJ2 | RJ3 |
| Pigment | — | P2 | Quinone pigment | Triphenylmethane pigment |
| Method of joining | Curing with heat | Curing with heat | Curing with heat | Curing with heat |
| Color before joining | Pale yellow | Blue | Blue | Red |
| Color after joining | Pale yellow | Pale yellow | Blue | Red |
| Resistance value ($\Omega$) | 1.22 | 1.22 | 1.21 | 1.22 |
| Adhesion strength (N/cm) | 8.7 | 8.7 | 8.8 | 8.7 |

Pale yellow: color of conductive particle

Figure 3:
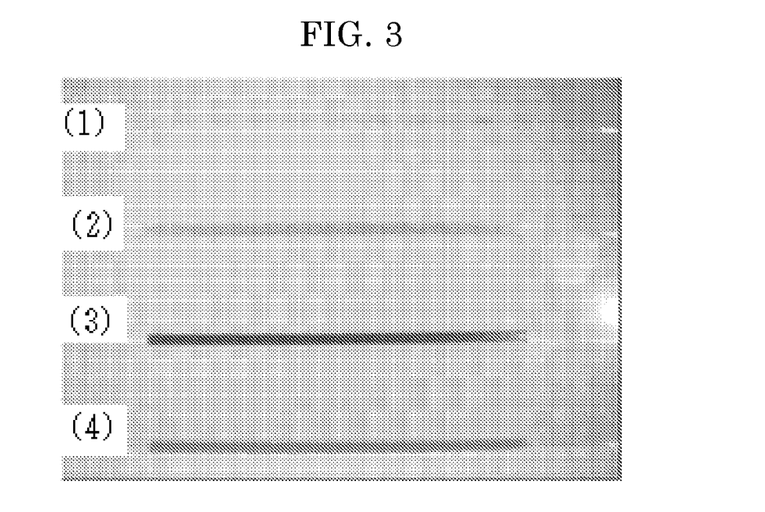

Regarding Example 2, since the radical joining material A2 was blue (bluish-green) (see (2) in FIG. 3), the affixation position of the connecting film could be clearly identified; also, since the radical joining material A2 loses the blue (bluish-green) color after the pressure bonding (see FIG. 5), the cure extent of the connecting film could be visually recognized and also corroded portions could be easily identified in an external appearance inspection of a joint surface of the joined structure AJ2 (inspection thereof for the number of conductive particles, a deformed state, etc.) and in a corrosion test on the joined structure AJ2. Similar results were obtained regarding Examples 1 and 3 to 19.

Figure 4:
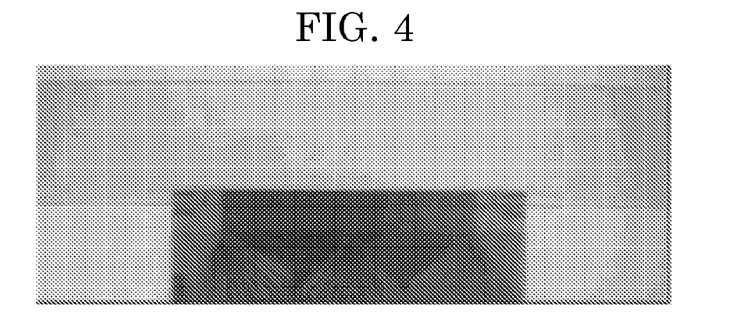
FIG. 4 is a photograph showing a result of confirmation of color erasure after assembly regarding Comparative Example 1.

Meanwhile, regarding Comparative Example 1, since the radical joining material R1 contained no pigment and was pale yellow (see (1) in FIG. 3), the affixation position of the connecting film could not be clearly identified, and the cure extent of the connecting film after the pressure bonding could not be visually confirmed (see FIG. 4). Similar results were obtained regarding Comparative Example 2.

Regarding Comparative Examples 3 and 4, since the pigments contained in the radical joining materials R2 and R3 did not lose color after the pressure bonding (see FIGS. 6 and 7), corroded portions were hard to identify in external appearance inspections of joint surfaces of the joined structures RJ2 and RJ3 (inspections thereof for the numbers of conductive particles, deformed states, etc.) and in corrosion tests on the joined structures RJ2 and RJ3.

What is claimed is:

1. A connecting film comprising:
   an organic resin layer which contains a color-erasing pigment, a curable organic resin, a curing agent and a conductive particle, wherein the color-erasing pigment contains a compound represented by General Formula (1) below:

General Formula (1)

where R1 and R2 each denote any one of a hydrogen atom, an alkyl group and an aryl group, Y denotes any one of a hydrogen atom, a halogen atom, an alkyl group, an aryl group, a dimethylamino group, a diethylamino group, a methoxy group and an ethoxy group, $Z^-$ denotes a counteranion, and n denotes an integer of 0 to 3, wherein Z denotes any one of $ClO_4$, $BF_4$, $CF_3SO_3$, a compound represented by General Formula (24) below, a compound represented by General Formula (25) below, a compound represented by General Formula (4) below, a compound represented by Structural Formula (1) below, and a compound represented by Structural Formula (2) below:

Structural Formula (24)

Structural Formula (25)

General Formula (4)

wherein R denotes one of a hydrogen atom and a fluorine atom,

Structural Formula (1)

Structural Formula (2)

wherein the connecting film is an anisotropic conductive film.

2. The connecting film according to claim 1, wherein the curable organic resin is an acrylic resin, and the curing agent is a radical curing agent.

3. The connecting film according to claim 1, wherein the curable organic resin is an epoxy resin, and the curing agent is a cationic curing agent.

4. The connecting film according to claim 1, wherein the color-erasing pigment is erased by heat.

* * * * *